April 20, 1965 E. W. REINWALL, JR 3,178,948

WAVE SIGNAL APPARATUS

Filed March 1, 1963

INVENTOR.

Ernest W. Reinwall, Jr.,

BY Mueller & Aichele

Attys

United States Patent Office 3,178,948
Patented Apr. 20, 1965

3,178,948
WAVE SIGNAL APPARATUS

Ernest W. Reinwall, Jr., McHenry, Ill., assignor to Motorola, Inc., Franklin Park, Ill., a corporation of Illinois Filed Mar. 1, 1963, Ser. No. 262,034
6 Claims. (Cl. 74—10.85)

This invention relates to tuner mechanisms for television receivers, and more particularly to a preset fine tuning system for such a tuner mechanism.

Television tuners, and especially automatic tuners, often incorporate the feature of preset fine tuning in the tuner mechanism. This enables the customer to preset the fine tuning for each channel and then merely turn the channel selector, either manually or automatically, to bring in a clear, properly tuned signal. In such tuners it is desirable to have some means for adjusting the fine tuning for each channel which is readily accessible to the user and simple to operate. Tuners have been constructed wherein the fine tuning may be preset by a particular manipulation of the same knob which is used to select the channel. Such tuners incorporate mechanisms which are complex and utilize a large number of mechanical parts, increasing the cost of the unit. As a result, the price of these types of tuners remains too high for most potential customers.

Accordingly, it is an object of this invention to provide an improved preset fine tuning mechanism which is relatively simple of construction, utilizing a minimum of parts.

Another object of the invention is to provide a preset fine tuning mechanism for a channel selector tuner which is low in cost and reliable of operation.

Another object of the invention is to provide a television tuner having a single control knob which may be pulled by the user to engage the fine tuning mechanism, and which is usable on both wafer and turret type channel selector tuners.

A feature of the invention is the provision of a preset fine tuner mechanism for a television tuner incorporating an idler mounted on a pivotal arm and displaceable by movement of the tuning sleeve to cause the idler to engage directly with the fine tuning screws.

Another feature of the invention is the provision of a "pull to fine tune" one knob tuner mechanism, wherein movement of the tuning sleeve causes a gear thereon to engage an adjusting idler while at the same time displacing the idler into engagement with a fine tuning screw for adjustment thereof.

Figures 1, 2, 3, 4:
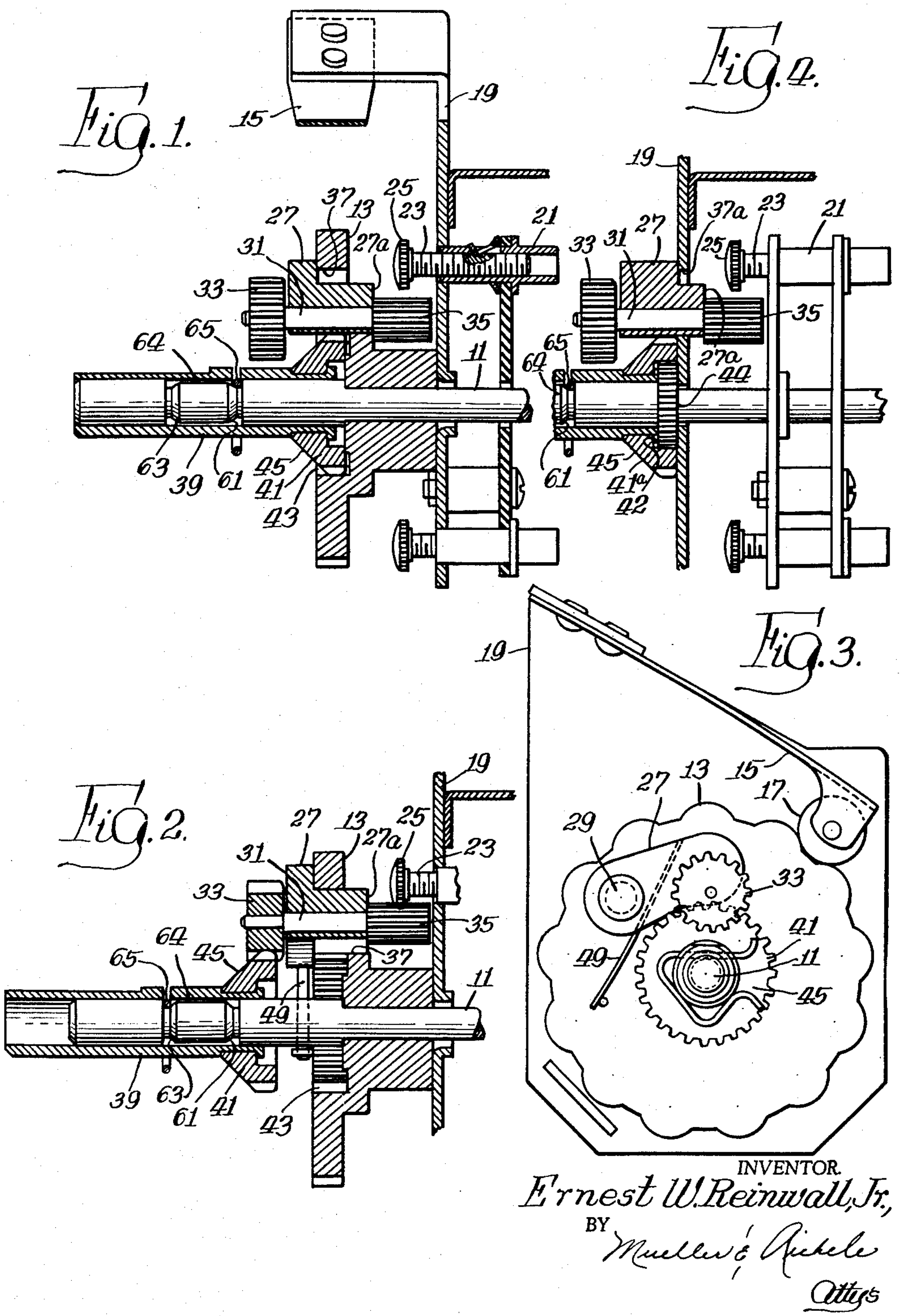
FIG. 1 is a half sectional view of a wafer type tuner mechanism constructed in accordance with the invention.
FIG. 2 is a half sectional view of the mechanism of FIG. 1, shown in position for fine tuning.
FIG. 3 is an end view of the mechanism of FIG. 1.
FIG. 4 is a partial half sectional view of a turret type tuner mechanism constructed in accordance with the invention.

The invention provides an improved fine tuning device for a television tuner of the channel selector type, having a rotatable channel selector shaft and a plurality of separate tuning elements for tuning television signals of different predetermined frequencies in a given frequency range. A tuning sleeve is rotatably supported in co-axial relation with the selector shaft and a plurality of independently adjustable fine tuning screws for fine adjustment of the various tuning elements representing the predetermined frequencies, are mounted in circular array about the selector shaft. A rotatable idler is mounted on a pivotal arm such that it is adjacent the circular array of fine tuning screws. In turret type tuners, the pivotal arm is mounted on the frame of the tuner, whereas in wafer type tuners, it is mounted on a wheel driven by the selector shaft. When used in connection with a turret type tuner, the fine tuning screws will rotate with the selector shaft, and the idler will remain essentially stationary. On the other hand when used with a wafer type tuner, the screws will remain stationary and the idler and pivotal arm will rotate with the selector shaft. In either case, rotation of the selector shaft serves to position the idler adjacent the proper screw.

A gear on the tuning sleeve in normal position drives the selector shaft, and is disengageable therefrom when the tuning sleeve is moved outwardly. This gear has a cam surface thereon which engages the idler as the tuning shaft is drawn outwardly, displacing the idler into engagement with the adjacent one of the fine tuning screws. Then when the tuning sleeve is rotated, the gear mounted thereon will turn the idler and consequently turn the fine tuning screw to fine tune the desired channel.

Referring now to FIGS. 1 through 3, a fine tuning mechanism for a wafer type tuner is shown. A wafer type tuner is generally characterized by a plurality of stationary wafers carrying the various circuit elements of the tuner, as is well known in the art. Contacts fixed on the wafers are controlled by rotation of a tuner control shaft 11 extending through the front plate 19 of the tuner. Positioning of control shaft 11 is accomplished by means of a detent wheel 13 which is engaged by a spring biased detent arm 15 and attached follower 17. Arm 15 is fixed to the front plate 19 of the tuner. Thus the selector shaft 11 is positioned for each channel over the frequency range of the tuner.

Within the particular channel position, means are provided for fine tuning the tuner to maintain a clear, sharp signal. In the tuner shown, this is accomplished by means of a plurality of oscillator coils 21 disposed circularly about the selector shaft 11. Each of oscillator coils 21 contains a screw 23 for varying the inductance thereof. Each of screws 23 is provided with a gear head 25 to facilitate adjustment which will be explained, and each screw is adjustable to fine tune the particular channel it represents. Accordingly, the position of a particular screw may be varied to preset the fine tuning for each channel of the tuner.

A pivotal arm 27 is mounted on the detent wheel 13 and is pivotal about a point 29. A double geared idler is mounted on the pivotal arm 27, which idler is comprised of a pair of gears 33 and 35 mounted at each end of a single idler shaft 31. Idler shaft 31, together with a portion of pivotal arm 27, extends through opening 37 in detent wheel 13 to permit arm 27 to be pivoted.

A tuning sleeve 39 is mounted coaxial with selector shaft 11, and may be controlled by a manual knob not shown. Mounted on sleeve 39 is drive gear 41. When the mechanism is in the position shown in FIG. 1, drive gear 41 engages internal clutch teeth 43 on the detent wheel 13. Since detent wheel 13 is fixed to selector shaft 11, drive gear 41 will drive the selector shaft for channel tuning of the tuner.

Drive gear 41 is provided with a cam surface 45 thereon. Sleeve 39 may be withdrawn (to the left in the drawing) and when this is done, drive gear 41 will disengage internal clutch teeth 43. As the sleeve 39 is withdrawn further, the cam surface 45 on drive gear 41 engages gear 33 on the idler shaft 31, displacing gear 33 upwardly. When sleeve 39 is drawn out fully to the position shown in FIG. 2, gear 41 will engage gear 33. As gear 33 is displaced upwardly due to the movement of pivotal arm 27, gear 35 will be moved to engage the gear head 25 of the adjacent one of oscillator screws 23. As a result, rotation of sleeve 39 will be transmitted through gear 33, idler shaft 31 and gear 35, to gear head 25 of screw 23. Accordingly, the position of screw 23 may be varied to fine tune the particular channel it represents.

It will be apparent, therefore, that this arrangement permits the fine tuning for each channel of the channel selector to be preset. When the fine tuning operation is completed, sleeve 39 may be returned inwardly to the position shown in FIG. 1, wherein gear 41 will re-engage internal clutch teeth 43 to permit channel tuning once again. Axial movement of sleeve 39 is limited by two detent positions determined by notches 61 and 63 in selector shaft 11 for channel tune and fine tune positions respectively. A retaining spring 65 slides with sleeve 39 on a portion 64 of reduced diameter in shaft 11, and drops in the appropriate one of notches 61 and 63 to lock sleeve 39 in one of the two positions. Gear 35 may be biased out of engagement with gear head 25 by means of a spring 49 engaging pivotal member 27. Outward travel of screws 23 is limited by the inner side 27*a* of pivotal arm 27, which engages gear head 25 to prevent overtravel beyond gear 25.

Referring now to FIG. 4, the invention is used in connection with a turret type tuner. In this type of tuner, the oscillator or fine tuning screws 23 are in fixed relationship to selector shaft 11, and accordingly are rotated therewith. As a result, pivotal member 27 may be mounted to the front plate 19 of the tuner so that it remains stationary in respect to the screws 23. Thus instead of having idler shaft 31 and its associated elements move to position gear 35 adjacent the respective ones of screws 23, the screws themselves will be moved to accomplish this.

The operation of the embodiment shown in FIG. 4, in fine tuning the oscillator screws, is essentially the same as that described for FIGS. 1 through 3. Gear 41*a* is internally toothed at 42 and a toothed clutch member 44 is fixed on the tuner shaft 11 in engagement with the teeth at 42. When gear 41*a* is drawn outwardly to engage clutch member 33, gear 44 disengages. Openning 37*a* is formed in frame 19 to allow arm 27 to pivot. The rest of the operation is identical with that of FIGS. 1–3.

Accordingly, the invention provides an improved preset fine tuning mechanism which is low in cost and reliable of operation. The number of parts is minimized and operation is simplified by utilizing a single control knob which may be pulled to permit presetting of the fine tuning, and tuned to select the channels when in unretracted position.

I claim:

1. A tuning device for a television tuner of the channel selector type having a rotatable selector shaft and a plurality of separate tuning elements with one for each channel of the channel selector, which elements provide tuning of television signals of different predetermined frequencies in a given frequency range, said device including in combination, a tuning sleeve rotatably supported in coaxial relation with the selector shaft, means coupling said tuning sleeve to said selector shaft, a plurality of independently adjustable fine tuning screws, one for each tuning element of the tuner for fine tuning the same, first means supporting said fine tuning screws arrayed circularly about the selector shaft, a rotatable idler, an arm supporting said rotatable idler adjacent the circular array of said fine tuning screws, second means supporting said arm for pivotal movement about a point displaced from said idler, which point is a fixed distance from the axis of said tuning sleeve, said idler being offset radially from both said fine tuning screws and said fine tuning sleeve, one of said first and second means being on the selector shaft and rotatable thereby to position said idler adjacent any one of said fine tuning screws as the channel corresponding to said one fine tuning screw is selected, rotatable means fixed to said fine tuning sleeve and engaging said idler upon axial movement of said fine tuning sleeve for driving said idler, said tuning sleeve being decoupled from the selector shaft when axially moved, and cam means actuable by axial movement of said tuning sleeve to cause said arm to pivot and bring said idler into engagement with the adjacent one of said fine tuning screws, said rotatable means operable by rotating said tuning sleeve to cause said rotatable means to rotate said idler and thereby adjust the fine tuning screw engaging the same, whereby fine tuning for each channel of the channel selector may be preset.

2. A tuning device for a television tuner of the channel selector type having a rotatable selector shaft and a plurality of separate tuning elements with one for each channel of the channel selector, which elements provide tuning of television signals of different predetermined frequencies in a given frequency range, said device including in combination, a tuning sleeve rotatably supported in coaxial relation with the selector shaft, drive gear means fixed to said tuning sleeve, clutch means coupled to the selector shaft and engageable by said drive gear means to drive the selector shaft, a plurality of independently adjustable gear head fine tuning screws, one for each tuning element of the tuner for fine tuning the same, first means supporting said fine tuning screws arrayed circularly about the selector shaft, idler gear means, a pivotal arm supporting said idler gear means adjacent the circular array of said fine tuning screws, second means supporting said arm for pivotal movement about a point displaced from said idler, which point is a fixed distance from the axis of said tuning sleeve, said idler gear means being offset radially from both said fine tuning screws and said tuning sleeve, one of said first and second means being on the selector shaft and rotatable thereby to position said idler gear means adjacent any one of said fine tuning screws as the channel corresponding to said one fine tuning screw is selected, said drive gear means being disengaged from said clutch means and engaged with said idler gear means upon axial movement of said tuning sleeve, and cam means actuable by axial movement of said tuning sleeve to cause said pivotal arm to pivot and bring said idler gear means into engagement with the gear head of the adjacent one of said fine tuning screws, said drive gear means being operable by rotating said fine tuning sleeve to cause said drive gear means to rotate said idler gear means and thereby adjust the fine tuning screw engaging the same, whereby fine tuning for each channel of the channel selector may be preset.

3. A tuning device for a television tuner of the channel selector type having a rotatable selector shaft and a plurality of separate tuning elements with one for each channel of the channel selector, which elements provide tuning of television signals of different predetermined frequencies in a given frequency range, said device including in combination, a tuning sleeve rotatably supported in coaxial relation with the selector shaft, toothed clutch means fixed to the selector shaft, a drive gear fixed to said tuning sleeve and engageable with said clutch means to drive the selector shaft, a plurality of independently adjustable fine tuning screws, one for each tuning element of the tuner for fine tuning the same, first means supporting said fine tuning screws arrayed circularly about the selector shaft, a pivotal arm having a rotatable idler thereon positioned adjacent the circular array of said fine tuning screws, second means supporting said arm for pivotal movement about a point displaced from said idler, which point is a fixed distance from the axis of said tuning sleeve, said idler being offset radially from both said fine tuning screws and said tuning sleeve, one of said first and second means being on the selector shaft and rotatable thereby to position said idler adjacent any one of said fine tuning screws as the channel corresponding to said one fine tuning screw is selected, said drive gear having a cam surface thereon engageable with said idler upon axial movement of said tuning sleeve outwardly of the tuner which movement disengages said drive gear from said clutch means, said cam surface acting to displace said idler toward the adjacent one of said fine tuning screws by pivotal movement of said pivotal arm, said drive gear engaging said idler when said tuning sleeve is in position to cause engagement of said idler with the adjacent one of said fine tuning screws, whereby said fine tuning screw may be adjusted to preset the fine tuning for that particular channel of the channel selector.

4. A tuning device for a television tuner of the channel selector type having a rotatable selector shaft and a plurality of separate tuning elements with one for each channel of the channel selector, which elements provide tuning of television signals of different predetermined frequencies in a given frequency range, said device including in combination, a tuning sleeve rotatably supported in coaxial relation with the selector shaft, toothed clutch means fixed to the selector shaft, a drive gear fixed to said tuning sleeve and engageable with said clutch means to drive the selector shaft, a plurality of independently adjustable gear head fine tuning screws, one for each tuning element of the tuner for fine tuning the same and arrayed circularly about the selector shaft, an arm pivotal in a plane generally perpendicular to the axis of said tuning sleeve and said selector shaft and having a common axis double gear idler thereon one gear of which is positioned adjacent the circular array of said fine tuning screws, the axis of said idler being offset radially from both said fine tuning screws and said tuning sleeve, support means on the selector shaft and supporting said arm, said support means being rotatable by said selector shaft to position said one gear of said idler adjacent any one of said fine tuning screws as the channel corresponding to said one fine tuning screw is selected, said drive gear having a cam surface thereon engageable with the other gear of said idler upon axial movement of said tuning sleeve outwardly of the tuner, which movement disengages said drive gear and said clutch means, said cam surface displacing said idler so that said one gear engages the gear head of the adjacent one of said fine tuning screws by pivotal movement of said arm, said drive gear engaging said other gear of said idler when said one gear of said idler engages the gear head of the adjacent one of said fine tuning screws to permit adjustment of the fine tuning screw engaging the same, whereby fine tuning for each channel of the channel selector may be preset.

5. A tuning device for a television tuner of the channel selector type having a frame, a rotatable selector shaft and a plurality of separate tuning elements with one for each channel of the channel selector, which elements provide tuning of television signals of different predetermined frequencies in a given frequency range, said device including in combination, a tuning sleeve rotatably supported in coaxial relation with the selector shaft, a toothed clutch member fixed to the channel selector shaft, a drive gear fixed to said tuning sleeve and having teeth engageable with said clutch member to drive the selector shaft, a plurality of independently adjustable fine tuning screws, one for each tuning element of the tuner for fine tuning the same and arrayed circularly about the selector shaft, an arm pivotally mounted on the frame and pivotal in a plane generally perpendicular to the axis of said tuning sleeve and said selector shaft and having a rotatable idler thereon positioned adjacent the circular array of said fine tuning screws, said idler being offset radially from both said fine tuning screws and said fine tuning sleeve, support means on the selector shaft and supporting said circular array of said fine tuning screws, said support means being rotatable by said selector shaft to position any one of said fine tuning screws adjacent said idler as the channel corresponding to said one fine tuning screw is selected, said drive gear having a cam surface thereon engageable with said idler upon axial movement of said tuning sleeve outwardly of the tuner, which movement disengages said drive gear and said clutch member, said cam surface displacing said idler into engagement with the adjacent one of said fine tuning screws by pivotal movement of said arm, said drive gear engaging said idler when said idler engages the adjacent one of said tuning screws to permit adjustment of the fine tuning screw engaging the same, whereby fine tuning for each channel of the selector shaft may be preset.

6. A tunning device for a television tuner of the channel selector type having a rotatable selector shaft and a plurality of separate tuning elements with one for each channel of the channel selector, which elements provide tuning of television signals of different predetermined frequencies in a given frequency range, said device including in combination, a tuning sleeve rotatably supported in coaxial relation with the selector shaft, toothed clutch means fixed to the channel selector shaft, a drive gear fixed to said tuning sleeve and engageable with said clutch means to drive the selector shaft, a plurality of independently adjustable gear head fine tuning screws, one for each tuning element of the tuner for fine tuning the same and arrayed circularly about the selector shaft, an arm pivotal in a plane generally perpendicular to the axis of said tuning sleeve and said selector shaft and having a rotatable idler thereon positioned adjacent the circular array of said fine tuning screws, said idler being offset radially from both said fine tuning screws and said tuning sleeve, support means on the selector shaft and supporting said arm, said support means being rotatable by said selector shaft to position said idler adjacent any one of said fine tuning screws as the channel corresponding to said one fine tuning screw is selected, said drive gear having a cam surface thereon engageable with said idler upon axial movement of said tuning sleeve outwardly of the tuner, which movement disengages said drive gear and said clutch means, said cam surface displacing said idler into engagement with the adjacent one of said fine tuning screws by pivotal movement of said arm, said drive gear engaging said idler when said idler engages the adjacent one of said fine tuning screws to permit adjustment of the fine tuning screw engaging the same, whereby fine tuning for each channel of the selector shaft may be preset.

References Cited by the Examiner

UNITED STATES PATENTS 3,058,075 10/62 Polley ............ 74—10.8 X
3,090,932 5/63 Torrence .......... 74—10.45 X BROUGHTON G. DURHAM, *Primary Examiner.*
MILTON KAUFMAN, *Examiner.*